US011169822B2

(12) United States Patent
Camarota et al.

(10) Patent No.: US 11,169,822 B2
(45) Date of Patent: Nov. 9, 2021

(54) CONFIGURING PROGRAMMABLE LOGIC REGION VIA PROGRAMMABLE NETWORK

(71) Applicant: Xilinx, Inc., San Jose, CA (US)

(72) Inventors: Rafael C. Camarota, San Jose, CA (US); David P. Schultz, Longmont, CO (US)

(73) Assignee: XILINX, INC., San Jose, CA (US)

(*) Notice: Subject to any disclaimer, the term of this patent is extended or adjusted under 35 U.S.C. 154(b) by 161 days.

(21) Appl. No.: 16/276,178

(22) Filed: Feb. 14, 2019

(65) Prior Publication Data
US 2020/0264901 A1    Aug. 20, 2020

(51) Int. Cl.
*G06F 9/445* (2018.01)
*G06F 13/40* (2006.01)
(52) U.S. Cl.
CPC ...... *G06F 9/44505* (2013.01); *G06F 13/4027* (2013.01)
(58) Field of Classification Search
CPC .................. G06F 9/44505; G06F 13/4027
See application file for complete search history.

(56) References Cited

U.S. PATENT DOCUMENTS

| 2015/0109024 | A1  | 4/2015  | Abdelfattah et al. |
| 2016/0344629 | A1* | 11/2016 | Gray ........................ H04L 45/60 |
| 2018/0287964 | A1  | 10/2018 | Gray |
| 2019/0103872 | A1* | 4/2019  | Clark ............... H03K 19/17708 |
| 2019/0140648 | A1* | 5/2019  | Clark ................. H03K 19/1776 |
| 2019/0363717 | A1* | 11/2019 | Swarbrick ............... G06F 21/76 |

FOREIGN PATENT DOCUMENTS

EP          1615139 A2    1/2006

* cited by examiner

*Primary Examiner* — Anh Q Tran
(74) *Attorney, Agent, or Firm* — Patterson + Sheridan, LLP

(57) ABSTRACT

Examples described herein provide for an integrated circuit (IC) having a programmable logic region that is capable of being configured via a programmable network. In an example, an IC includes a programmable logic region, a controller, and a programmable network. The programmable network is connected between the controller and the programmable logic region. The controller is programmed to configure the programmable logic region via the programmable network. In some examples, the programmable logic region can be configured faster, among other benefits.

21 Claims, 9 Drawing Sheets

US 11,169,822 B2

CONFIGURING PROGRAMMABLE LOGIC REGION VIA PROGRAMMABLE NETWORK

TECHNICAL FIELD

Examples of the present disclosure generally relate to an integrated circuit (IC) having programmable logic and methods of configuring the programmable logic and, in particular, to an IC and methods of configuring programmable logic via a programmable network.

BACKGROUND

Programmable integrated circuits (ICs) are generally user configurable and capable of implementing logic operations. There are several types of programmable ICs, including Complex Programmable Logic Devices (CPLDs) and Field Programmable Gate Arrays (FPGAs), for example. CPLDs include function blocks based on programmable logic array (PLA) architecture and programmable interconnect lines to route and transmit signals between the function blocks. FPGAs include configurable logic blocks (CLBs), input output blocks (IOBs), and programmable interconnect lines that route and transmit signals. The function blocks of CPLDs, CLBs of FPGAs, and interconnect lines are configured by data stored in a configuration memory of the respective devices. The programmable interconnects and programmable logic are typically programmed by loading configuration data into internal configuration memory cells that define how the programmable elements are configured.

SUMMARY

Examples described herein provide for an integrated circuit (IC) having a programmable logic region that is capable of being configured via a programmable network. The programmable network can be a high speed communication network. In some examples, the programmable logic region can be configured faster, among other benefits.

An example of the present disclosure is an IC. The IC includes a programmable logic region, a controller, and a programmable network. The programmable network is connected between the controller and the programmable logic region. The controller is programmed to configure the programmable logic region via the programmable network.

Another example of the present disclosure is a method for operating one or more integrated circuits. At least a portion of a programmable logic region is configured. Configuring at least the portion of the programmable logic region comprises transmitting first configuration data from a controller via a programmable network. Application data is communicated with the configured portion of the programmable logic region via the programmable network.

Another example of the present disclosure is a multi-chip apparatus. The multi-chip apparatus includes a first chip and a second chip. The first chip includes a first Network-on-Chip (NoC), a first programmable logic region, a first configuration frame driver, and a controller. The controller is communicatively connected to a network of the first NoC. The network of the first NoC is communicatively connected to the first programmable logic region and the first configuration frame driver. The first configuration frame driver is communicatively connected to the first programmable logic region. The second chip includes a second NoC, a second programmable logic region, and a second configuration frame driver. A network of the second NoC is communicatively connected to the network of the first NoC, the second programmable logic region, and the second configuration frame driver. The second configuration frame driver is communicatively connected to the second programmable logic region. The controller is configured to transmit first configuration data via the network of the first NoC to the first configuration frame driver. The controller is configured to transmit second configuration data via the network of the first NoC and the network of the second NoC to the second configuration frame driver.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
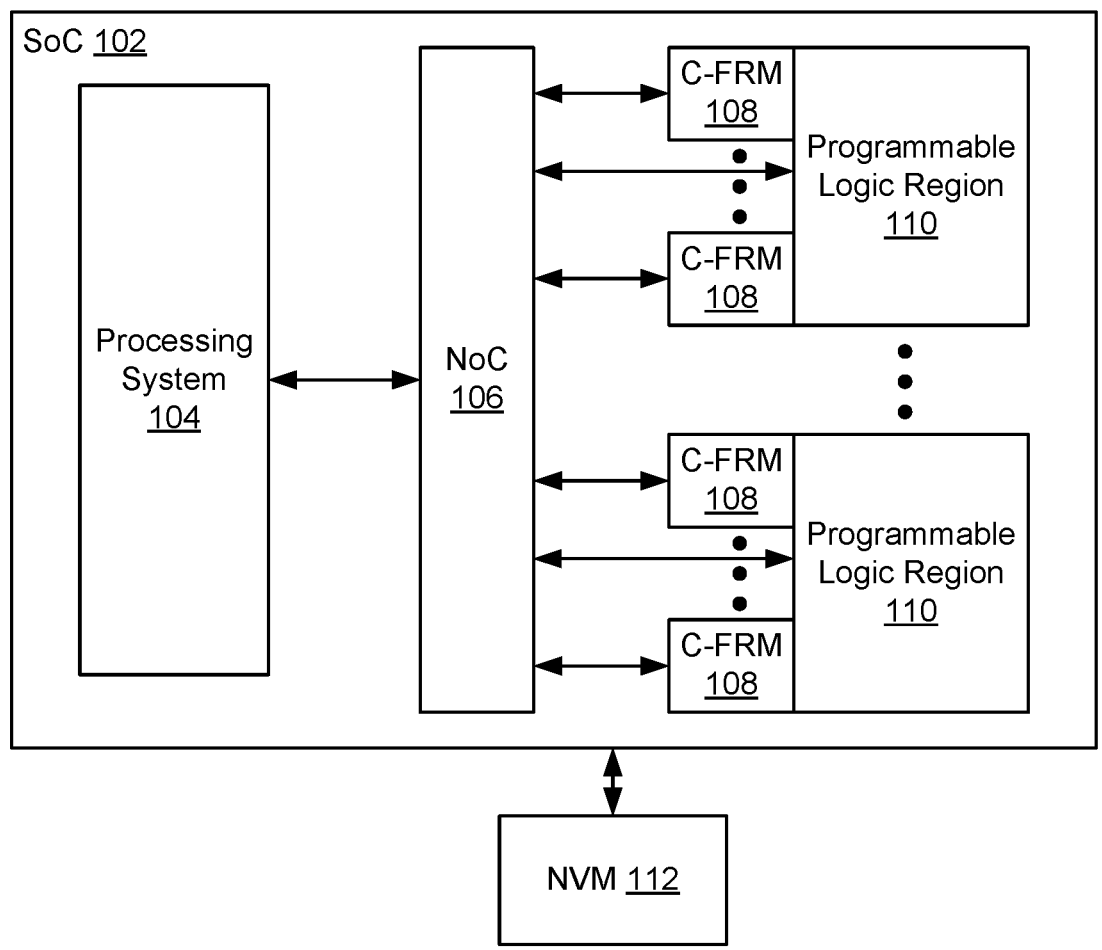
FIG. 1 is a block diagram depicting a system-on-chip (SoC) according to some examples.

Examples described herein provide for an integrated circuit (IC) that includes one or more programmable logic regions and methods for operating such an IC. In some examples, the IC includes a communication network (e.g., a programmable network of a Network-on-Chip (NoC)) that can implement communications between, e.g., a logic function, an application, a kernel, and/or the like instantiated on a programmable logic region of the IC and another component or circuit. The communication network can be a high bandwidth, high speed network, for example. Further, configuration data for configuring the one or more programmable logic regions can be communicated through the communication network. Communicating configuration data for programmable logic regions through such a communication network can permit high speed transmission and parallel processing of such data. This can permit programmable logic regions to be configured faster.

In further examples, a multi-chip structure is provided where chips can include a respective IC that includes one or more programmable logic regions. The ICs in the multi-chip structure can include a communication network that can implement communications between, e.g., a logic function, etc. instantiated on a programmable logic region of any of the ICs and another component or circuit in any of the ICs. Further, configuration data for configuring one or more programmable logic regions can be communicated through the communication network. For example, a master IC can communicate configuration data through the communication network from the master IC to a slave IC. Such examples can permit simpler circuits (e.g., processing systems) on slave ICs.

In Field Gate Programmable Array (FPGA) architectures, a dedicated configuration frame driver has been implemented for communicating configuration data to programmable logic regions (e.g., the fabric) of the FPGA. The dedicated configuration frame driver has been a low bandwidth serial connection to the programmable logic regions that does not permit parallel processing of configuration data. Additionally, the dedicated configuration frame driver does not permit out-of-order configuration. Accordingly, configuring the programmable logic regions of such FPGAs could be a relatively slow process.

System-on-Chips (SoCs) are being developed that include programmable logic regions of an FPGA architecture. These SoCs can be capable of providing an integrated solution for a number of applications. Some of such SoCs are being developed to include a high bandwidth, high speed NoC. In some examples, a SoC includes a number of segments of a configuration frame driver that correspond to respective sub-regions of programmable logic regions. Configuration data can be delivered to the configuration frame segment drivers via the network of the NoC, which permits a high speed delivery of the configuration data. Further, segmenting the configuration frame driver permits more localized and parallel processing of configuration data to configure the programmable logic regions. It is envisioned that in some examples an increase in bandwidth is 100 times more than a dedicated configuration frame driver.

Further, it is envisioned that some examples described herein may be implemented in virtualized computing, such as in cloud data centers. In a data center, a client may lease portions of programmable logic regions in which to implement the client's design (e.g., a logic function, etc.). The virtualized nature of such a data center can cause the programmable logic regions to be configured and reconfigured (e.g., by partial reconfiguration) a number of times to maximize the economic benefit of leasing such programmable logic regions. To further maximize the economic benefit, configuring or reconfiguring the programmable logic regions should be as fast as possible to reduce down time where the client may not be able to implement its design. Some examples provided herein can increase the speed of configuring programmable logic regions (e.g., fully configuring and/or partially reconfiguring), which can increase the economic benefit associated with a data center, for example. Additionally, in further examples, clients may further pay more or less for weights or priority in virtual channels implemented in a network of a NoC for configuration data. The weights or priority can increase or decrease the speed with which the configuration data is routed through the network of the NoC.

Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various directions or orientations are described as, e.g., a column and a row. These designations are for ease of description of generally perpendicular directions or orientations, and other directions or orientations may be implemented.

FIG. 1 is a block diagram depicting a SoC 102 according to some examples. The SoC 102 is an IC that is a programmable logic device, such as a FPGA. The SoC 102 comprises a processing system 104, a NoC 106, configuration frame segment drivers 108, and one or more programmable logic regions 110. The SoC 102 may further include other circuits, such as a memory controller, multi-gigabit transceivers (MGTs), input/output blocks (IOs), and other IP circuits. The SoC 102 is communicatively coupled to external memory, e.g., non-volatile memory (NVM) 112.

In general, the processing system 104 is connected to the programmable logic region(s) 110 through the NoC 106 and configuration frame segment drivers 108. The processing system 104 and programmable logic region(s) 110 are further connected to the NoC 106 separate from the configuration frame segment drivers 108, and hence, may be communicatively coupled to each other via the NoC 106.

The processing system 104 can include one or more processor cores. For example, the processing system 104 can include a number of ARM-based embedded processor cores. The programmable logic region(s) 110 can include any number of configurable logic blocks, look-up tables, digital signal processing blocks, random access memory (RAM) blocks, UltraRAM blocks, and programmable interconnect elements. The programmable logic region(s) 110 may be programmed or configured using the processing system 104 through the NoC 106 and respective configuration frame segment drivers 108. For example, the NoC 106 and configuration frame segment drivers 108 can enable, for example, frame-based programming of the fabric of the programmable logic region(s) 110 by a controller (e.g., a processor core) of the processing system 104 (such as a platform management controller (PMC)). The controller (e.g., PMC) can be programmed to perform various functionality as described herein, such as programming or configuring the programmable logic region(s) 110 and the NoC 106.

The NoC 106 includes end-to-end Quality-of-Service (QoS) features for controlling data-flows therein. In examples, the NoC 106 first separates data-flows into designated traffic classes. Data-flows in the same traffic class can either share or have independent virtual or physical transmission paths. The QoS scheme applies multiple levels of priority across traffic classes. Within and across traffic classes, the NoC 106 applies a weighted arbitration scheme to shape the traffic flows and provide bandwidth and latency that meets the user requirements. Examples of the NoC 106 are discussed further below.

Figure 2:
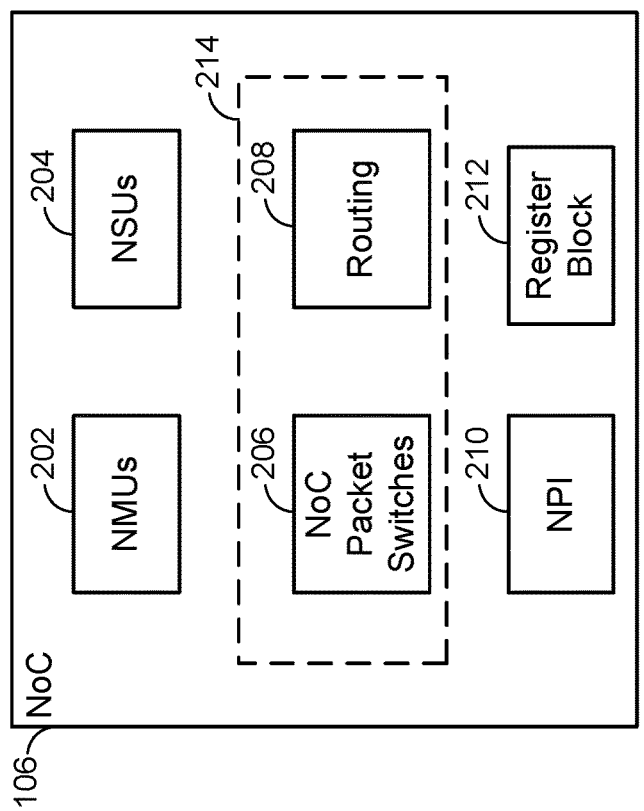
FIG. 2 is a block diagram depicting a Network-on-Chip (NoC) of a SoC according to some examples.

FIG. 2 is a block diagram depicting the NoC 106 of a SoC according to some examples. The NoC 106 includes NoC master units (NMUs) 202, NoC slave units (NSUs) 204, a network 214, NoC peripheral interconnect (NPI) 210, and register blocks 212. Each NMU 202 is an ingress circuit that connects a master circuit to the NoC 106. Each NSU 204 is an egress circuit that connects the NoC 106 to a slave endpoint circuit. The NMUs 202 are connected to the NSUs 204 through the network 214. In some examples, the network 214 includes NoC packet switches 206 and routing 208 between the NoC packet switches 206. Each NoC packet switch 206 performs switching of NoC packets. The NoC packet switches 206 are connected to each other and to the NMUs 202 and NSUs 204 through the routing 208 to implement a plurality of physical channels. The NoC packet switches 206 also support multiple virtual channels per physical channel. The NPI 210 includes circuitry to write to register blocks 212 that determine the functionality of the NMUs 202, NSUs 204, and NoC packet switches 206. The NPI 210 includes a peripheral interconnect coupled to the register blocks 212 for programming thereof to set functionality. The register blocks 212 in the NoC 106 support interrupts, QoS, error handling and reporting, transaction control, power management, and address mapping control. Some configuration data for the NoC 106 can be stored in the NVM 112, for example, and provided to the NPI 210 for programming the NoC 106 and/or other slave endpoint circuits.

Figure 3:
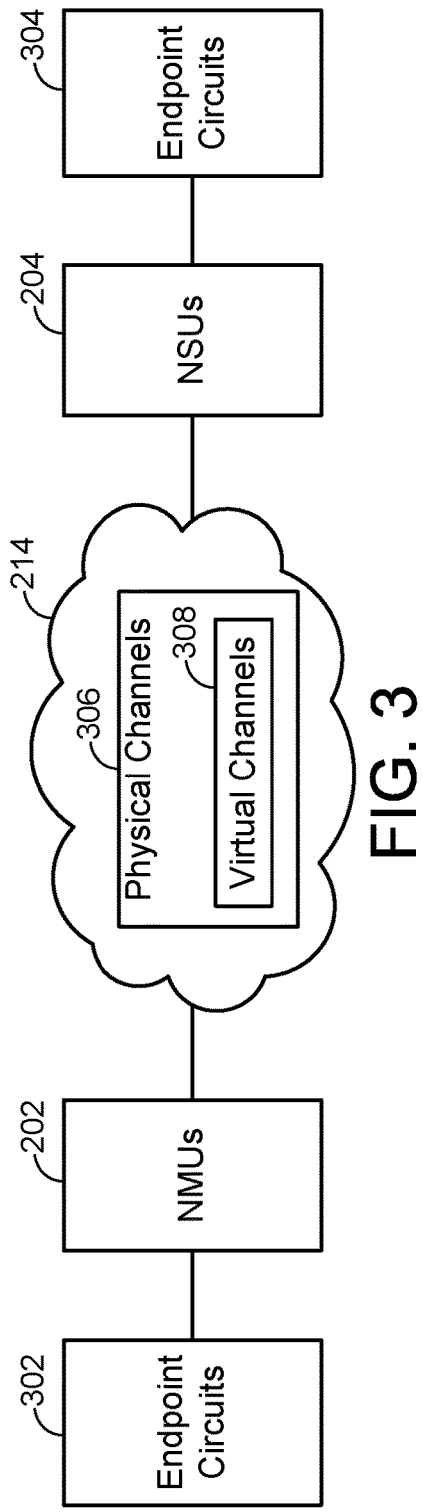
FIG. 3 is a block diagram depicting connections between endpoint circuits in a SoC through a NoC according to some examples.

FIG. 3 is a block diagram depicting connections between endpoint circuits in a SoC through the NoC 106 according to some examples. In the example, endpoint circuits 302 are connected to endpoint circuits 304 through the NoC 106. The endpoint circuits 302 are master circuits, which are coupled to NMUs 202 of the NoC 106. The endpoint circuits 304 are slave circuits coupled to the NSUs 204 of the NoC 106. Each endpoint circuit 302 and 304 can be a circuit in the processing system 104, a circuit in a programmable logic region 110, or a circuit in another subsystem. Each endpoint circuit in the programmable logic region 110 can be a dedicated circuit (e.g., a hardened circuit) or a circuit configured in programmable logic.

The network 214 includes a plurality of physical channels 306. The physical channels 306 are implemented by programming the NoC 106. Each physical channel 306 includes one or more NoC packet switches 206 and associated routing 208. An NMU 202 connects with an NSU 204 through at least one physical channel 306. A physical channel 306 can also have one or more virtual channels 308. The virtual channels 308 can implement weights to prioritize various communications along any physical channel 306. Configuration data communicated through the network 214, as described in more detail below, can be assigned any weight or priority. For example, configuration data can be assigned a weight or priority based on a customer's targeted speed of implementing a design.

Figure 4:
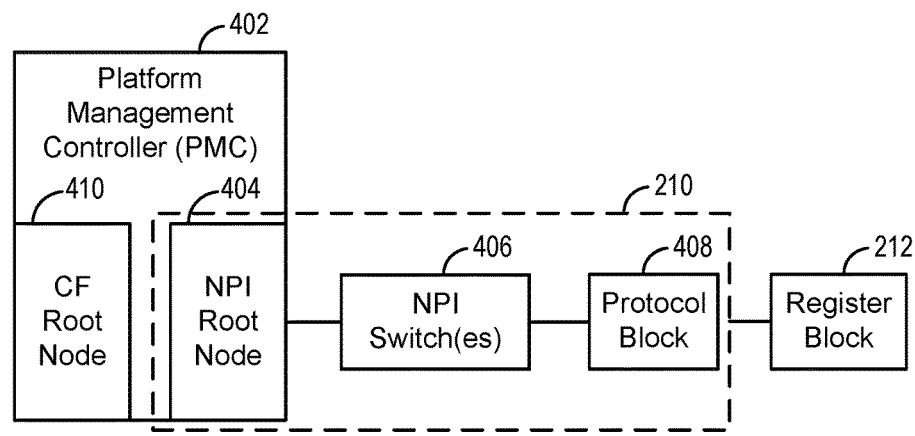
FIG. 4 is a block diagram depicting connections to a register block through a NoC peripheral interconnect (NPI) according to some examples.

FIG. 4 is a block diagram depicting connections to a register block 212 of, e.g., an NMU 202, NoC packet switch 206, or NSU 204 through the NPI 210 in a SoC 102 according to some examples. To connect to a register block 212, the NPI 210 includes an NPI root node 404, interconnected NPI switches 406, and a protocol block 408. The NPI root node 404 resides on a platform management controller (PMC) 402, which resides in the processing system 104 of the SoC 102.

Generally, the NPI root node 404 can packetize a transaction request, such as a write or read request, into a format implemented by the NPI 210 and can transmit a memory-mapped transaction request to interconnected NPI switches 406. The transaction request can be routed through the interconnected NPI switches 406 to a protocol block 408 connected to the register block 212 to which the transaction request is directed. The protocol block 408 can then translate the memory-mapped transaction request into a format implemented by the register block 212 and transmit the translated request to the register block 212 for processing. The register block 212 can further transmit a response to the transaction request through the protocol block 408 and the interconnected NPI switches 406 to the NPI root node 404, which then responds to the master circuit that issued the transaction request.

The NPI root node 404 can translate a transaction request between a protocol used by the one or more master circuits, such as the PMC 402, and a protocol used by the NPI 210. For example, the master circuits can implement the Advanced eXtensible Interface fourth generation (AXI4) protocol, and the NPI 210 can implement an NPI Protocol. The protocol blocks 408 can also translate the transaction request from the protocol implemented on the NPI 210 to a protocol implemented by the register blocks 212 of the NoC packet switches 206. In some examples, the protocol blocks 408 can translate between NPI Protocol and the Advanced Microcontroller Bus Architecture (AMBA) 3 Advanced Peripheral Bus (APB3) protocol or a proprietary protocol like a configuration frame driver.

The PMC 402 further includes a configuration frame driver (CF) root node 410. The configuration frame driver root node 410 is an endpoint circuit 302 to the network 214 of the NoC 106. The configuration frame driver root node 410 is configured to program the fabric of the programmable logic regions 110 by transmitting NoC protocol packets via an NMU 202 and network 214 to respective NSUs 204 that can translate the NoC protocol packets to configuration frames that are implemented by respective configuration frame segment drivers 108. The configuration frame segment drivers 108 are delivery mechanisms for programming programmable units of the programmable logic regions 110 on the SoC 102.

Figure 5:
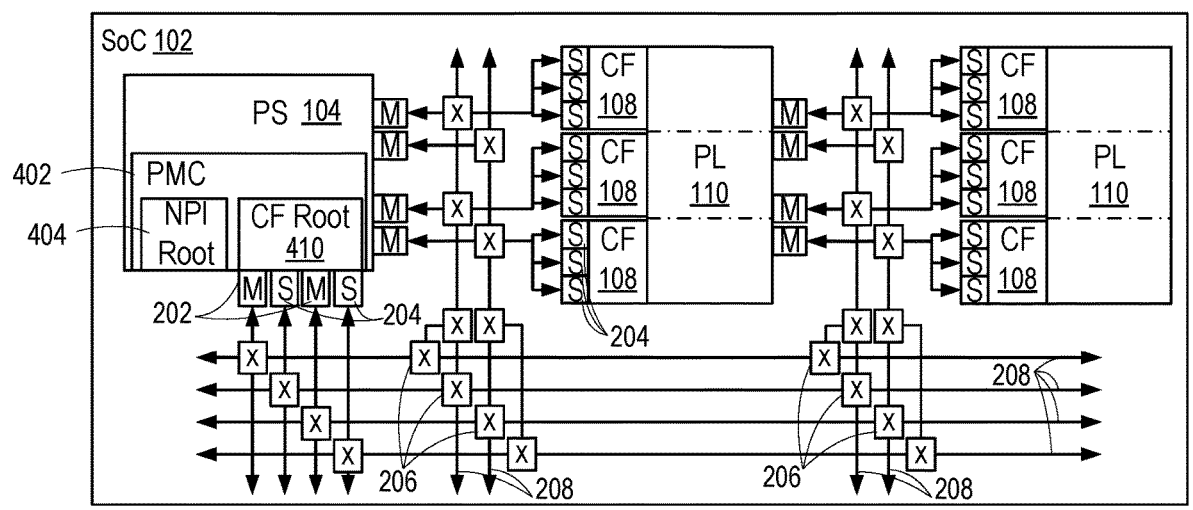
FIG. 5 is a diagram depicting additional details of a SoC according to some examples.

FIG. 5 is a diagram depicting additional details of the SoC 102 according to some examples. Various NMUs 202 (each labeled with an "M") and NSUs 204 (each labeled with an "S") are interconnected via NoC packet switches 206 (each labeled with an "X") and routing 208. FIG. 5 illustrates connections of the processing system 104 (including the PMC 402 with NPI root node 404 and configuration frame driver root node 410), configuration frame segment drivers 108, and programmable logic regions 110 to the NoC 106.

Each programmable logic region 110 is separated into multiple sub-regions for configuration, and each sub-region of a programmable logic region 110 has a corresponding configuration frame segment driver 108. The sub-regions of the programmable logic region 110 can correspond to a size or period of the corresponding configuration frame segment drivers 108. FIG. 5 illustrates multiple NSUs 204 at each configuration frame segment driver 108. One or more of the NSUs 204 is configured to communicate configuration data with the corresponding configuration frame segment driver 108 for configuring the corresponding sub-region of the programmable logic region 110. If applicable, for example, one or more of the NSUs 204 is configured to communicate with corresponding configuration frame segment driver 108 for preloading and sampling data from block memory in the corresponding sub-region of the programmable logic region 110. One or more of the NSUs 204 is configured to communicate application data with the corresponding sub-region of the programmable logic region 110, e.g., with logic functions, applications, and/or kernels instantiated on the sub-region of the programmable logic region 110.

Figure 6:
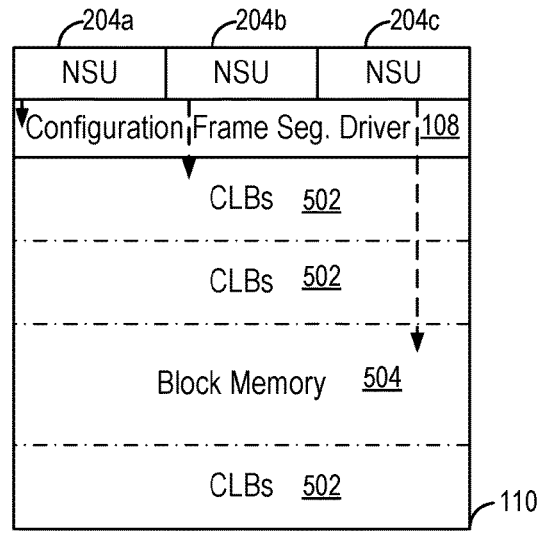
FIG. 6 is a block diagram depicting NoC slave units (NSUs) at a configuration frame segment driver according to some examples.

FIG. 6 illustrates NSUs 204a, 204b, 204c at a configuration frame segment driver 108 according to some examples. The NSU 204a is communicatively coupled to the configuration frame segment driver 108 to transfer configuration data of the sub-region of the programmable logic region 110 to the configuration frame segment driver 108 from the NoC 106. The configuration frame segment driver 108 configures the sub-region of the programmable logic region 110 using the configuration data. The NSU 204b is communicatively coupled to an interconnect network connected to the logic elements, e.g., columns of configurable logic blocks (CLBs) 502, of the sub-region of the programmable logic region 110 for communicating, via the NoC 106, application data with logic functions, etc. instantiated in the sub-region of the programmable logic region 110. The NSU 204c is communicatively coupled to columns of block memory 504, such as block RAMs (BRAMs), UltraRAMs (URAMs), look-up-table RAMs (LUTRAMs), and/or the like, for preloading and sampling data from the block memory 504.

Figure 7:
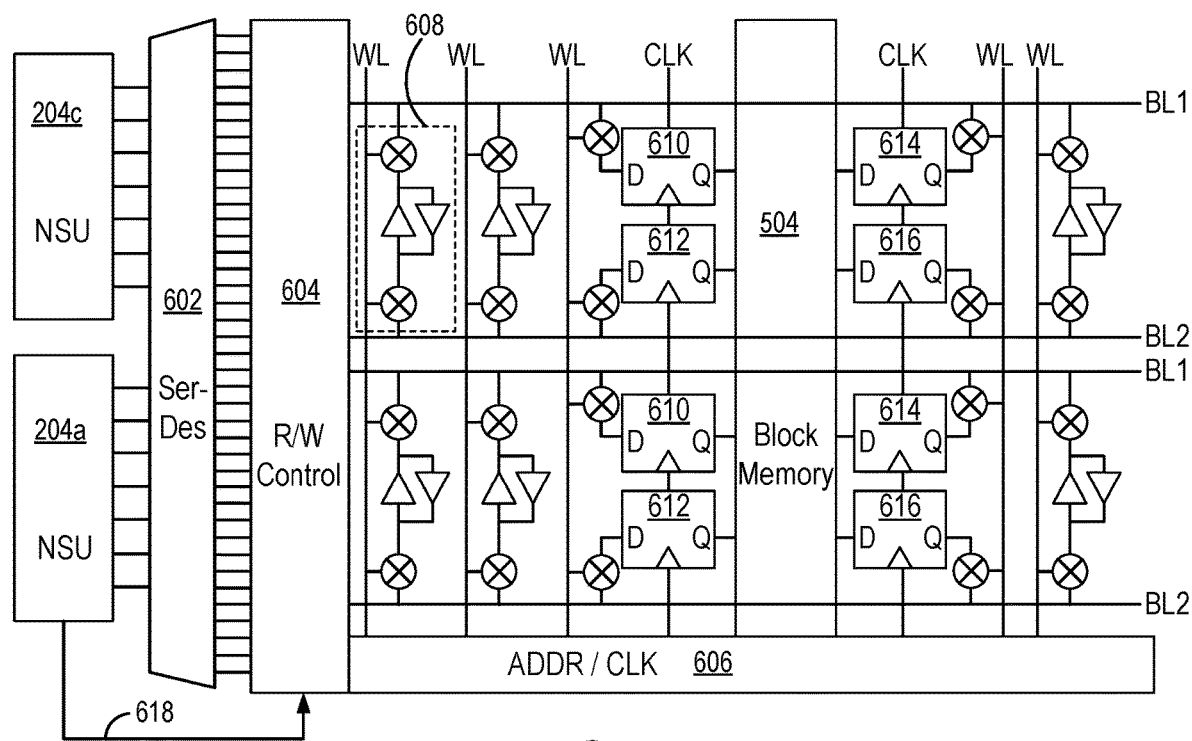
FIG. 7 is a diagram depicting additional details of FIG. 6 according to some examples.

FIG. 7 illustrates additional details of FIG. 6 according to some examples. The configuration frame segment driver 108 of FIG. 6 includes a serial-deserializer circuit (SerDes) 602, a read/write control circuit (R/W Control) 604, and an address decoder and clock circuit (ADDR/CLK) 606. A portion of a sub-region of the programmable logic region 110 includes a number of columns and rows of configuration memory cells 608 (one specifically identified) for configuring, e.g., CLBs 502. The portion of the sub-region of the programmable logic region 110 also includes flip-flops 610, 612 for preloading data into block memory 504 and flip-flops 614, 616 for sampling data from the block memory 504.

The NSUs 204a, 204c receive packets from the network 214 (e.g., routing 208 and NoC packet switches 206) of the NoC 106. The configuration memory cells 608, bits for block memory 504, and register(s) storing sub-region control signals 618 are mapped to an address space of the NoC 106. Accordingly, packets addressed to the configuration memory cells 608 and register(s) for storing sub-region control signals 618 of the sub-region of the programmable logic region 110 are routed by the network 214 to the NSU 204a, and packets addressed to bits for block memory 504 of the sub-region of the programmable logic region 110 are routed by the network 214 to the NSU 204c. The NSUs 204a, 204c are configured to translate the packets to a format that is usable by the configuration frame segment driver 108.

The NSUs 204a, 204c are electrically connected to the serial-deserializer circuit 602. The NSUs 204a, 204c output data corresponding to the received packets to the serial-deserializer circuit 602. The serial-deserializer circuit 602 deserializes the data output from the NSUs 204a, 204c and converts the data into frame words implemented by the read/write control circuit 604. The serial-deserializer circuit 602 is electrically connected to the read/write control circuit 604 and is configured to communicate converted frame words to the read/write control circuit 604. Additionally, the NSU 204a is electrically connected to the read/write control circuit 604 to write sub-region control signals 618 to register(s) in the read/write control circuit 604.

In addition to register(s) for storing the sub-region control signals 618, the read/write control circuit 604 includes a logic circuit configured to read and write to configuration memory cells 608 and to block memory 504. The logic circuit can, for example, be enabled by one or more sub-region control signals 618. The sub-region control signals 618 can indicate a mode, such as a configure mode, functional (e.g., mission) mode, test mode, diagnostic mode, power up/down mode, or the like, that the logic circuit enters and implements.

The read/write control circuit 604 is further electrically connected to the address decoder and clock circuit 606. The read/write control circuit 604 can communicate data from a frame word to the address decoder and clock circuit 606. The address decoder and clock circuit 606 includes a logic circuit to decode the data to identify a word line of a column in which a configuration memory cell 608 or block memory 504 that is to be written or read is disposed. The address decoder and clock circuit 606 further includes a circuit configured to generate or otherwise provide one or more clock signals.

The sub-region of the programmable logic region 110 includes a number of columns of configuration memory cells 608 (three columns illustrated), a number of columns of block memory 504 (one column illustrated), and possibly, a number of columns of other configurable logic (e.g., digital signal processing (DSP) blocks, programmable interconnect (INT) elements, etc.). The sub-region illustrated in FIG. 7 is a simplified illustration, as a person having ordinary skill in the art will readily understand. As illustrated, each column of configuration memory cells 608 has a word line WL that extends from the address decoder and clock circuit 606 along the respective column, and each column of block memory 504 has two word lines WL and two clock lines CLK that extend from the address decoder and clock circuit 606 along the respective column. A number of rows (two illustrated) extend across the various configurable logic elements in the sub-region of the programmable logic region 110. Each row has a first bit line BL1 and a second bit line BL2 that extend from the read/write control circuit 604 along the respective row.

In the illustrated example, each configuration memory cell 608 is a static random access memory (SRAM) cell, although other memory cells may be implemented as the configuration memory cells 608. Although not specifically labeled, each configuration memory cell 608 includes cross-coupled inverters that are coupled via transmission gates between the first bit line BL1 and the second bit line BL2 of the row in which the configuration memory cell 608 is disposed. The transistors of the transmission gates of the configuration memory cell 608 have respective gates that are coupled to the word line WL (or inverted or complementary word line) of the column in which the configuration memory cell 608 is disposed. In other examples, pass-gate transistors may be implemented instead of or in addition to the transmission gates.

The block memory 504 has a preload stage and a sample stage. The preload stage includes flip-flops 610, 612. The flip-flops 610, 612 are disposed in a same column. The flip-flop 610 has a data input node (D) that is electrically coupled, via a transmission gate, to the first bit line BL1 of the row in which the flip-flop 610 is disposed. The flip-flop 612 has a data input node (D) that is electrically coupled, via another transmission gate, to the second bit line BL2 of the row in which the flip-flop 612 is disposed. The flip-flops 610, 612 each have a data output node (Q) connected to the block memory 504. The flip-flops 610, 612 further each have a clock input node connected to the clock line CLK of the column in which the flip-flops 610, 612 are disposed. The respective transmission gates coupling the data input node (D) of the flip-flop 610 to the first bit line BL1 and the data input node (D) of the flip-flop 612 to the second bit line BL2 have gates that are coupled to the word line WL of the column in which the flip-flops 610, 612 are disposed.

The sample stage includes flip-flops 614, 616. The flip-flops 614, 616 are disposed in a same column. The flip-flops 614, 616 each have a data input node (D) connected to the block memory 504. The flip-flop 614 has a data output node (Q) that is electrically coupled, via a transmission gate, to the first bit line BL1 of the row in which the flip-flop 614 is disposed. The flip-flop 616 has a data output node (Q) that is electrically coupled, via another transmission gate, to the second bit line BL2 of the row in which the flip-flop 616 is disposed. The flip-flops 614, 616 further each have a clock input node connected to the clock line CLK of the column in which the flip-flops 614, 616 are disposed. The respective transmission gates coupling the data output node (Q) of the flip-flop 614 to the first bit line BL1 and the data output node (Q) of the flip-flop 616 to the second bit line BL2 have gates that are coupled to the word line WL of the column in which the flip-flops 614, 616 are disposed.

The configuration frame segment driver 108 is configured to read or write a configuration memory cell 608 based on a frame word, for example. The frame word can identify the configuration memory cell 608 to be read or written, whether the configuration memory cell 608 is to be read or written, and, if written, the data to be stored in the configuration memory cell 608. The address decoder and clock circuit 606 determines in which column the configuration memory cell 608 is disposed and asserts a signal on the word line WL of that column to enable to the transmission gates of the configuration memory cell 608. The read/write control circuit 604 determines in which row the configuration memory cell 608 is disposed and whether the configuration memory cell 608 is to be read or written. If a read is determined, the read/write control circuit 604 enables, e.g., a differential driver to sense the differential signal between the first bit line BL1 and the second bit line BL2 of the row in which the configuration memory cell 608 is disposed. If a write is determined, the read/write control circuit 604 drives the first bit line BL1 and the second bit line BL2 of the row in which the configuration memory cell 608 is disposed to complementary values to write an appropriate value to the configuration memory cell 608. During the reading of or writing to a configuration memory cell 608, the corresponding first bit line BL1 and second bit line BL2 are operated as complementary bit lines (e.g., as a bit line BL and a complementary bit line BLB) as a person having ordinary skill in the art will readily understand. Writing to a configuration memory cell 608 can configure a logic element in the sub-region of the programmable logic region 110. Reading a configuration memory cell 608 can be performed to test the fidelity of the configuration of a logic element in the sub-region of the programmable logic region 110.

The configuration frame segment driver 108 is further configured to sample (read) or preload (write) a block memory 504 based on a frame word, for example. The frame word can identify the block memory 504 to be sampled or preloaded, whether the block memory 504 is to be sampled or preloaded, and, if preloaded, the data to be stored in the block memory 504. The address decoder and clock circuit 606 determines in which column the flip-flops 610-616 to be preloaded or sampled is disposed and asserts a signal on the word line WL of that column to enable to the transmission gates of the flip-flops 610-616. The read/write control circuit 604 determines in which row the flip-flops 610-616 to be preloaded or sampled are disposed and whether the flip-flops 610-616 are to be preloaded or sampled. If a sample is determined, the read/write control circuit 604 enables drivers to sense respective signal on the first bit line BL1 and the second bit line BL2 of the row in which the flip-flops 614, 616 are disposed. If a write is determined, the read/write control circuit 604 drives the first bit line BL1 and the second bit line BL2 of the row in which the flip-flops 610, 612 are disposed to signals to write respective values to the flip-flops 610, 612.

During the sampling or preloading to flip-flops 610-616, the corresponding first bit line BL1 and second bit line BL2 can be operated independently of each other. Operating the first bit line BL1 and second bit line BL2 independently can permit two bits to be preloaded into flip-flops 610, 612 (e.g., one to each flip-flop 610, 612) and to be sampled from flip-flops 614, 616 (e.g., one to each flip-flop 610, 612) for a single operation. The independent operation of the first bit line BL1 and second bit line BL2 during preloading and sampling can enable a two times greater bandwidth than, e.g., reading and writing the configuration memory cells 608 (e.g., preloading/sampling of the flip-flops 610-616 can be at twice a rate of reading/writing of the configuration memory cells 608).

The example illustrated in FIG. 7 can have shortened lines (e.g., bit lines and/or word lines) relative to other programmable devices. The separating and segmenting of the programmable logic regions 110 and configuration frame segment drivers 108 permits these lines to be shortened. By shortening lines, bandwidth for reading/writing and/or sampling/preloading can be increased.

Additionally, since sub-regions of programmable logic region(s) 110 have separate configuration frame segment drivers 108, configuration data for writing to configuration memory cells 608 can be communicated via the network 214 of the NoC 106 to different configuration frame segment drivers 108 for processing the configuration data and configuring the respective sub-regions of the programmable logic region(s) 110 in parallel. This parallel processing and parallel configuring can further increase a speed in configuring one or more programmable logic regions 110.

Figure 8:
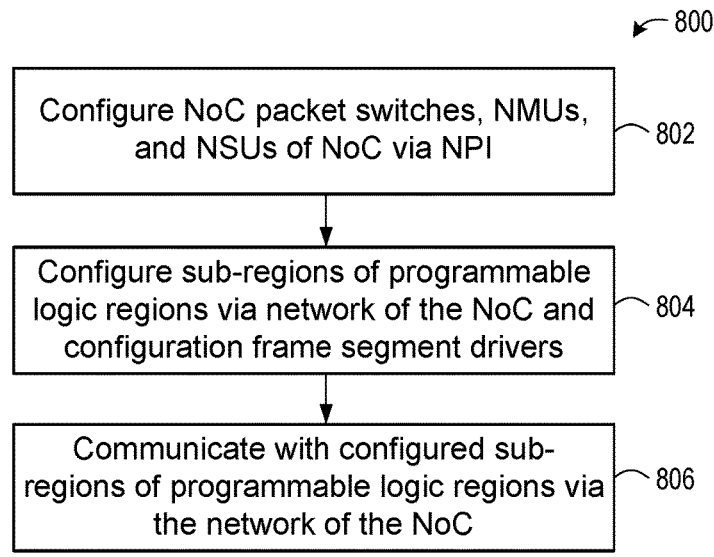
FIG. 8 is a flow chart of a method of operating an integrated circuit (IC) according to some examples.

FIG. 8 is a flow chart of a method 800 of operating an IC according to some examples. The IC includes a programmable logic region and NoC, such as described above.

At block 802, NoC packet switches, NMUs, and NSUs of a NoC are configured via a NPI. In the examples described above, for example, the processing system 104 (e.g., the PMC 402) obtains configuration data of the NoC 106. The processing system 104 (e.g., the PMC 402) transfers the configuration data to the NPI root node 404, which packetizes the configuration data in to memory mapped transaction requests. The NPI root node 404 transmits the memory mapped transaction requests to the NPI switches 406, which route the transaction requests to appropriate protocol blocks 408. The protocol blocks 408 then translate the memory-mapped transaction requests into formats implemented by the respective register block 212 and transmit the translated requests to the register blocks 212 of the NoC packet switches 206, NMUs 202, and NSUs 204 for processing. The appropriate data corresponding to the configuration data for the NoC packet switches 206, NMUs 202, and NSUs 204 is written to the register blocks 212 of the NoC packet switches 206, NMUs 202, and NSUs 204 to configure those NoC packet switches 206, NMUs 202, and NSUs 204.

The configuration of the NoC packet switches, NMUs, and NSUs to configure the NoC can be any configuration. The configuration can be, e.g., a minimal configuration to enable communicating configuration data for a programmable logic region through the NoC, a full system level configuration to enable communication across the NoC for any component, or any configuration therebetween.

At block 804, one or more sub-regions of one or more programmable logic regions are configured via the network of the NoC and respective configuration frame segment drivers. In the examples described above, for example, the processing system 104 (e.g., the PMC 402) obtains configuration data of the sub-region of the programmable logic region 110. The processing system 104 (e.g., the PMC 402) transfers the configuration data to the configuration frame driver root node 410, which packetizes the configuration data in to NoC protocol packets. The configuration frame driver root node 410 transmits the NoC protocol packets to one or more NMUs 202, which transmits the NoC protocol packets to the network 214 of the NoC 106. The NoC protocol packets are then routed through various NoC packet switches 206 and routing 208 in the network 214 of the NoC 106 to the appropriate NSU 204*a*. The NSU 204*a* translates the NoC packets to a format usable by the configuration frame segment driver 108 and transmits the corresponding data to the configuration frame segment driver 108. The serial-deserializer circuit 602 of the configuration frame segment driver 108 deserializes the data output from the NSU 204*a* and converts the data into frame words implemented by the read/write control circuit 604 of the configuration frame segment driver 108. The frame word is transmitted to the read/write control circuit 604, and the read/write control circuit 604 and address decoder and clock circuit 606, based on the frame work, assert signals on the corresponding word line WL, first bit line BL1, and second bit line BL2 to write to configuration memory cells 608 in the sub-region of the programmable logic region 110. Writing to configuration memory cells 608 can configure configurable elements to implement various logic functions, applications, and/or kernels.

At block 806, various components or circuits in the IC communicate with the configured sub-regions of programmable logic regions via the network of the NoC. Referring again to the examples described above, any component or circuit, e.g., the processing system 104, another programmable logic region 110, a memory controller, a MGT, an IO, etc., can communicate, e.g., application data through the network 214 of the NoC 106 to a configured sub-region of the programmable logic region 110.

In some examples, the communication is not through a configuration frame segment driver 108. The component or circuit can transmit a NoC protocol packet containing application data via an NMU 202 and the network 214 (e.g., various NoC packet switches 206 and routing 208) to an NSU 204*b*. The NSU 204*b* translates the NoC protocol packets to a format usable by the logic function, etc., of the configured sub-region of the programmable logic region 110 and transmits the corresponding data to the interconnect network of the programmable logic region 110, which routes the data as appropriate. The logic function, etc., can respond to such communications using the same or similar path (e.g., in reverse), and/or can initiate a communication using a same or similar path (e.g., from interconnect network of the programmable logic region 110 to NMU 202, to network 214, to NSU 204, and to a component or circuit).

In some examples, the communication can be also through a configuration frame segment driver 108. The component or circuit can transmit a NoC protocol packet via an NMU and network 214 to an NSU 204*c*. The NSU 204*c* translates the NoC protocol packets to a format usable by the configuration frame segment driver 108 and transmits the corresponding data to the configuration frame segment driver 108. The serial-deserializer circuit 602 of the configuration frame segment driver 108 deserializes the data output from the NSU 204*c* and converts the data into frame words implemented by the read/write control circuit 604 of the configuration frame segment driver 108. The frame word is transmitted to the read/write control circuit 604, and the read/write control circuit 604 and address decoder and clock circuit 606, based on the frame work, assert a signal on the corresponding word line WL, and assert or sense signals on the corresponding first bit line BL1 and second bit line BL2 to preload data in flip-flops 610, 612 or sample data from flip-flops 614, 616 in block memory 504 of the programmable logic region 110.

Figure 9:
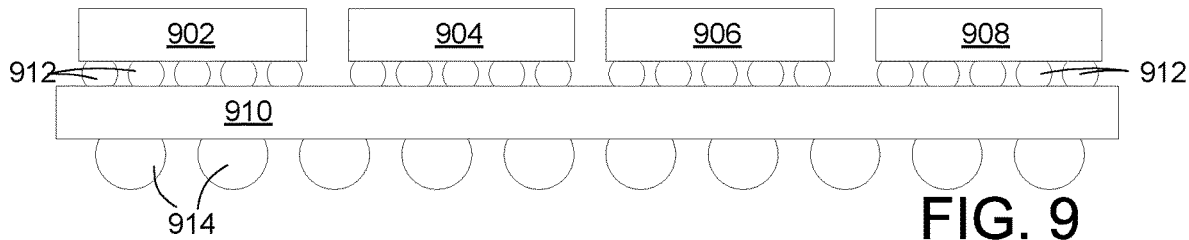
FIG. 9 is a block diagram of a multi-chip structure according to some examples.

FIG. 9 is a block diagram of a multi-chip structure, such as a two-and-a-half-dimensional integrated circuit (2.5DIC) structure, according to some examples. The 2.5DIC structure includes a first chip 902, a second chip 904, a third chip 906, and a memory chip 908 attached to an interposer 910 or another substrate. In other examples, the 2.5DIC structure may have fewer or more chips, and the memory chip 908 may be outside of, but communicatively coupled to, the 2.5DIC structure. Each of the first chip 902, second chip 904, and third chip 906 can be or include an integrated circuit (IC), such as a system-on-chip (SoC) as described below. The memory chip 908 can comprise any form of memory for storing data, such as configuration data. The first chip 902, second chip 904, third chip 906, and memory chip 908 are attached to the interposer 910 by electrical connectors 912, such as microbumps, metal pillars (e.g., copper pillars), or the like. Electrical connectors 914 are on a side of the interposer 910 opposite from the chips 902, 904, 906, 908 for attaching the 2.5DIC structure to another substrate, such as a package substrate, for example. The electrical connectors 914 may be controlled collapse chip connection (C4) bumps, ball grid array (BGA) balls, or the like.

The interposer 910 includes electrical interconnects that electrically connect various ones of the chips 902, 904, 906, 908. The electrical interconnects can include one or more metallization layers or redistribution layers on the side of the interposer 910 on which the chips 902, 904, 906, 908 are attached, one or more through substrate vias (TSVs) through the bulk substrate (e.g., silicon substrate) of the interposer 910, and/or one or more metallization layers or redistribution layers on the side of the interposer 910 opposing the side on which the chips 902, 904, 906, 908 are attached. Hence, various signals, packets, etc. can be communicated between various ones of the chips 902, 904, 906, 908.

In other examples, more or fewer chips may be included, and the chips may be in other configurations. For example, more or fewer chips that include a SoC may be implemented, such as two, four, or more chips, and more or fewer memory chips may be included. In some examples, the multi-chip structure can include various stacked chips, such as in a three-dimensional IC (3DIC) structure. For example, two or more memory chips may be stacked on each other with the bottom memory chip being attached to the interposer 910. Other multi-chip structures may be implemented in other examples, such as without an interposer. Various modifications may be made that would be readily apparent to a person having ordinary skill in the art.

Figure 10:
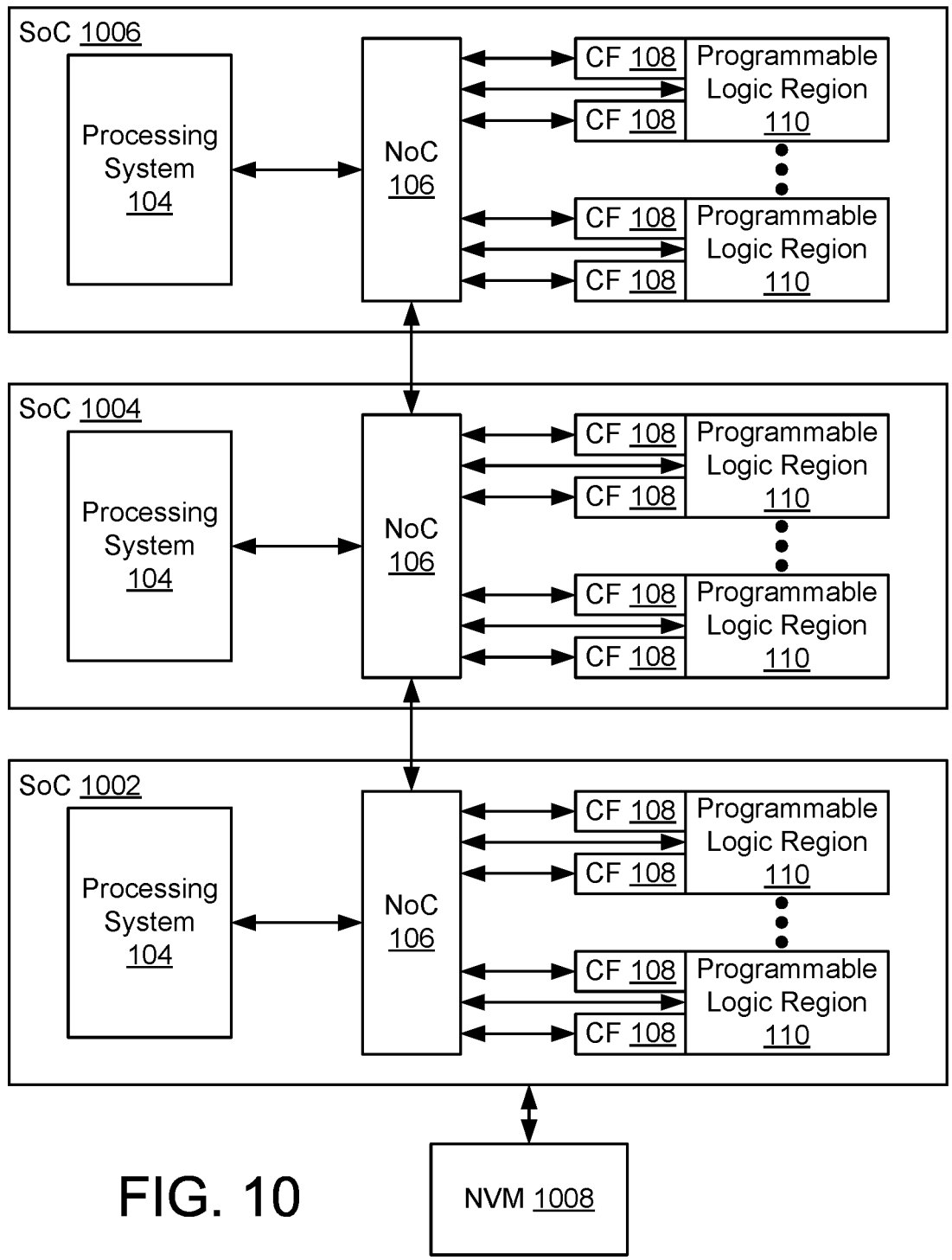
FIG. 10 is a block diagram depicting a multi-chip structure with multiple chips each having a SoC according to some examples.

FIG. 10 is a block diagram depicting a multi-chip structure with multiple chips each having a SoC according to some examples. The multi-chip structure includes a SoC 1002 (e.g., on the first chip 902 of FIG. 1), a SoC 1004 (e.g., on the second chip 904), and a SoC 1006 (e.g., on the third chip 906). Each SoC 1002, 1004, 1006 is an IC comprising a processing system 104, a NoC 106, configuration frame segment drivers 108, and one or more programmable logic regions 110, as described above with respect to the SoC 102 of FIG. 1. Each SoC 1002, 1004, 1006 can be coupled to external circuits, and as illustrated, the SoC 1002 is coupled to NVM 1008 (e.g., on the memory chip 908 in FIG. 9). The NVM 1008 can store data that can be loaded to the SoCs 1002, 1004, 1006 for configuring the SoCs 1002, 1004, 1006, such as configuring the NoC 106 and the programmable logic region(s) 110. As illustrated in FIGS. 9 and 10, the NVM 112 is on the memory chip 908 attached to the interposer 910; however, in other examples, memory, such as flash memory, can be external to the multi-chip structure and communicatively coupled to the SoC 1002, such as via an serial peripheral interface (SPI). For example, the memory may be attached to a same package substrate to which the multi-chip structure is attached, and may communicate with the SoC 1002 via the package substrate.

In general, the processing system 104 of each SoC 1002, 1004, 1006 is connected to the programmable logic region(s) 110 through the NoC 106 alone and through the NoC 106 with the configuration frame segment drivers 108. Additionally, the NoC 106 of each SoC 1002, 1004, 1006 is connected to the NoC 106 of each neighboring SoC 1002, 1004, 1006. For example, the NoCs 106 of the SoCs 1002, 1004 are connected, and the NoCs 106 of the SoCs 1004, 1006 are connected. The NoCs 106 being connected permits communication between the SoCs 1002, 1004, 1006 via the NoCs 106.

Figure 11:
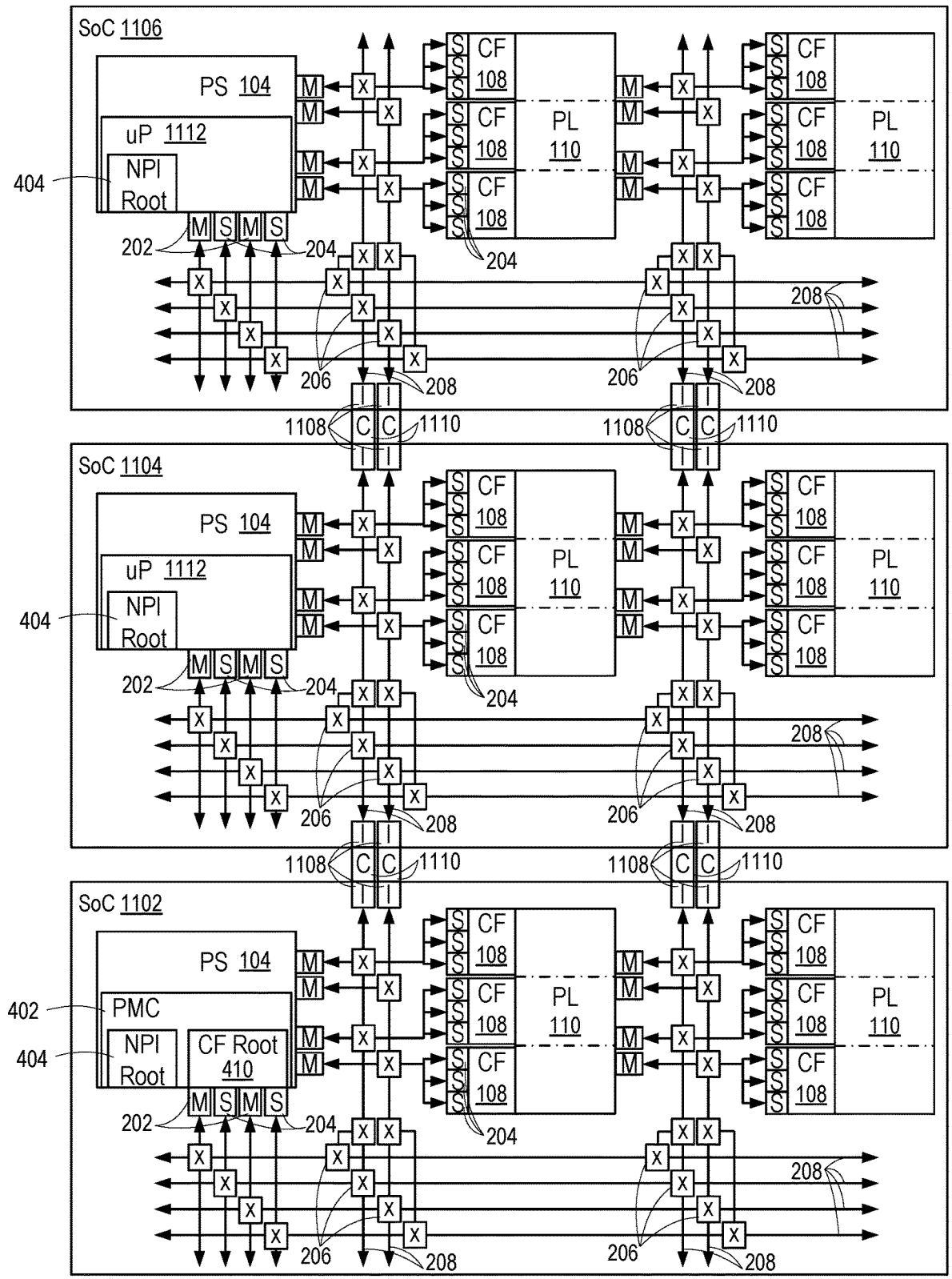
FIG. 11 is a diagram depicting additional details of a multi-chip structure with multiple chips each having a SoC according to some examples.

FIG. 11 is a block diagram depicting a multi-chip structure with interconnected NoCs 106 according to some examples. FIG. 11 illustrates some aspects of the multi-chip structure of FIG. 10 in more detail while omitting other aspects so as not to obscure aspects described here. The multi-chip structure includes SoCs 1102, 1104, 1106, each of which generally have the structure of the SoC 102 of FIG. 5. Description of corresponding structure between the SoC 102 and the SoCs 1102, 1104, 1106 is omitted here for brevity.

Routing 208 of each NoC 106 is connected to interposer drivers 1108 (each labeled with an "I"), which are in turn connected to external connectors 1110 (each labeled with a "C") to interconnect the NoCs 106 of the SoCs 1102, 1104, 1106. The external connectors 1110 can be or include, for example, bumps attaching the respective chips to an interposer and/or metallization layers or redistribution layers on the interposer, such as described with respect to FIG. 9. Routing 208 of the NoC 106 of SoC 1102 is connected to respective interposer drivers 1108 of the SoC 1102, which are connected via external connectors 1110 to respective interposer drivers 1108 of the SoC 1104. The interposer drivers 1108 of the SoC 1104 are connected to routing 208 of the NoC 106 of SoC 1104. Routing 208 of the NoC 106 of SoC 1104 is connected to respective other interposer drivers 1108 of the SoC 1104, which are connected via external connectors 1110 to respective interposer drivers 1108 of the SoC 1106. The interposer drivers 1108 of the SoC 1106 are connected to routing 208 of the NoC 106 of SoC 1106.

In some examples, the SoCs 1104, 1106 do not include a PMC 402 and configuration frame driver root node 410 in the respective processing system 104. The SoCs 1104, 1106 may include a processor 1112 (e.g., a microprocessor), including an NPI root node 404, that has reduced functionality compared to a PMC 402. In some examples, the processor 1112 may implement some basic redundancy repair and feature enablement and may implement a minimal configuration on the respective SoC 1104, 1106, and PMC 402 of the SoC 1102 acts as a master to the SoCs 1104, 1106 to implement a system-level configuration and to configure programmable logic regions 110 in the SoCs 1102, 1104, 1106. In other examples, each SoC 1102, 1104, 1106 can include a PMC 402 and configuration frame driver root node 410 for configuring the various components of the respective SoC 1102, 1104, 1106.

Figure 12:
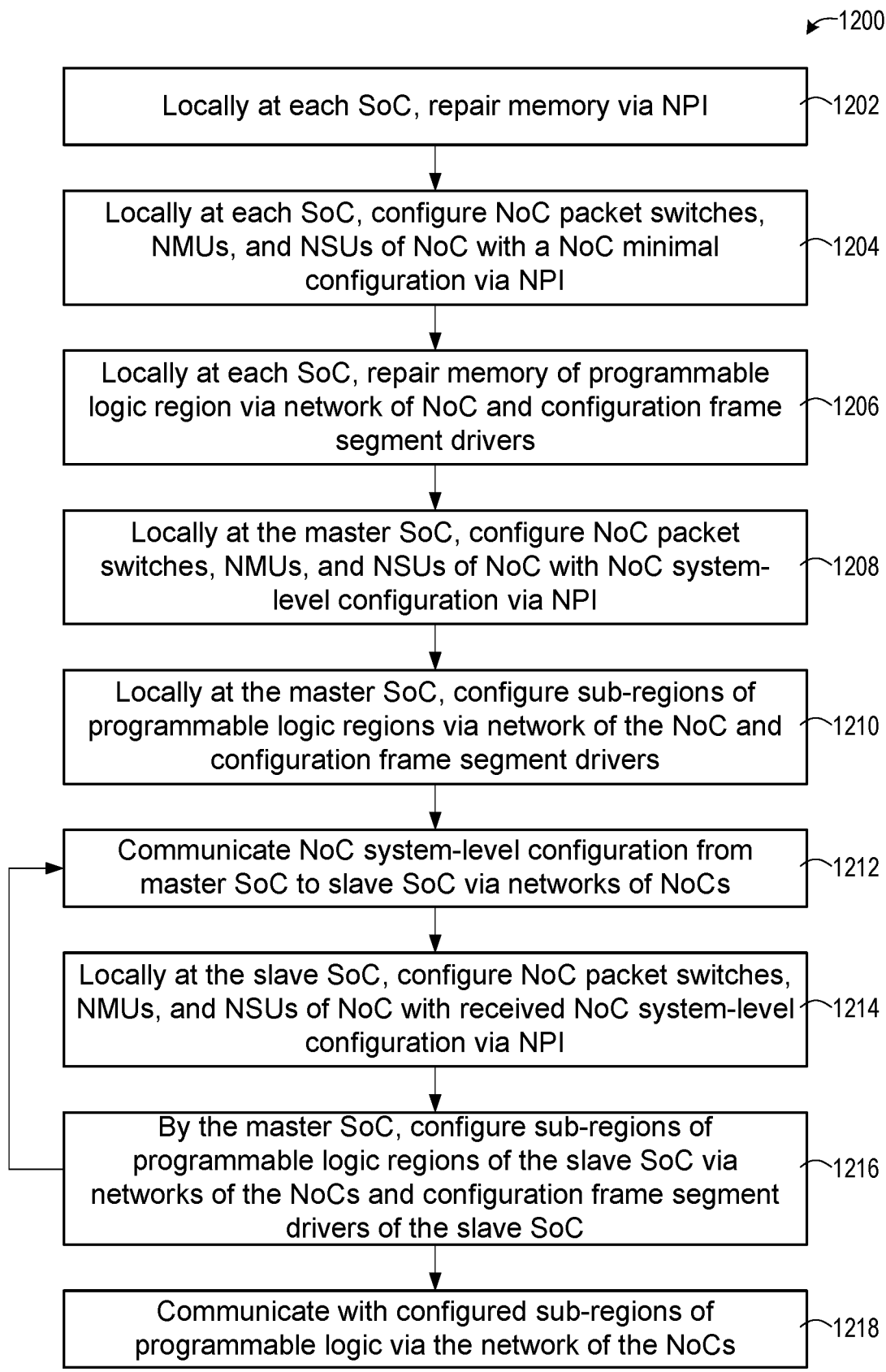
FIG. 12 is a flowchart of a method for operating a multi-chip structure according to some examples.

FIG. 12 is a flowchart of a method 1200 for operating a multi-chip structure according to some examples. The method 1200 is described in the context of the SoC 1102 acting as a master and the SoCs 1104, 1106 acting as slaves. The slave SoCs 1104, 1106 include a simplified processor 1112 as described above. Accordingly, in the method 1200, some configurations in the slave SoCs 1104, 1106 can be initiated by the PMC 402 of the master SoC 1102 and communicated through networks 214 of the NoCs 106 of the SoCs 1102, 1104, 1106. In other examples, each SoC 1102, 1104, 1106 may be configured locally independent of other SoCs 1102, 1104, 1106.

At block 1202, locally at each SoC, memory that is not in a programmable logic region is repaired via the NPI of the respective SoC. In some examples, each SoC 1102, 1104, 1106 has electric fuses (eFuses) that are programmed at manufacturing with values to permit repair of faulty memory by enabling redundant memory. The PMC 402 or processor 1112 of the respective SoC 1102, 1104, 1106 is capable of reading the values of the eFuses and responsively transmitting memory mapped transactions from the NPI root node 404 via the NPI 210 to various register blocks 212 to repair memory by redundancy built into the respective SoC 1102, 1104, 1106. The register blocks 212 can be in respective NMUs 202, NSUs 204, NoC packet switches 206, interposer drivers 1108, or any other memory within the address space of the NPI 210 of the respective SoC 1102, 1104, 1106.

At block 1204, locally at each SoC, NoC packet switches, NMUs, and NSUs of the NoC of the respective SoC are configured with a NoC minimal configuration via the NPI. The NoC minimal configuration establishes a communication channel between the PMC 402 or processor 1112 of the respective SoC 1102, 1104, 1106 to configuration frame segment drivers 108 of that SoC 1102, 1104, 1106. Additionally, the NoC minimal configuration communicatively connects (e.g., as a bridge) the network 214 of the NoC 106 of each slave SoC 1104, 1106 to the network 214 of a NoC 106 of a neighboring SoC proximate to the master SoC 1102 so communication between the master SoC 1102 and the slave SoC 1104, 1106 may be established.

Each SoC 1102, 1104, 1106 can have memory, such as read only memory (ROM), on-chip or off-chip that is electrically connected to the SoC that stores the NoC minimal configuration data. The PMC 402 or processor 1112 of the respective SoC 1102, 1104, 1106 reads the NoC minimal configuration data from the memory and transfers the NoC minimal configuration data to the NPI root node 404. The NPI root node 404 packetizes the NoC minimal configuration data as memory mapped transactions and transmits the memory mapped transactions via the interconnected NPI switches 406 of the NPI 210 to protocol blocks 408 of appropriate NoC packet switches 206, NMUs 202, and NSUs 204 of the NoC 106 of the respective SoC 1102, 1104, 1106. The protocol blocks 408 then translate the memory-mapped transaction requests into formats implemented by the respective register block 212 and transmit the translated requests to the register blocks 212 of the NoC packet switches 206, NMUs 202, and NSUs 204 for processing. The appropriate data corresponding to the NoC minimal configuration data for the NoC packet switches 206, NMUs 202, and NSUs 204 is written to the register blocks 212 of the NoC packet switches 206, NMUs 202, and NSUs 204 to configure those NoC packet switches 206, NMUs 202, and NSUs 204.

After the NoCs 106 are configured with the NoC minimal configuration, the NoC 106 of the master SoC 1102 is configured to permit communications between the PMC 402 (e.g., the configuration frame driver root node 410) and the configuration frame segment drivers 108 of the SoC 1102. The NoC 106 of the slave SoC 1104 is configured to permit communications between the processor 1112 and the configuration frame segment drivers 108 of the SoC 1104 and to permit communications received from at least some of the external connectors 1110 electrically connected between the SoCs 1102, 1104. The NoC 106 of the slave SoC 1106 is configured to permit communications between the processor 1112 and the configuration frame segment drivers 108 of the SoC 1106 and to permit communications received from at least some of the external connectors 1110 electrically connected between the SoCs 1104, 1106.

At block 1206, locally at each SoC, memory of a programmable logic region is repaired via the network of the NoC and configuration frame segment drivers of the respective SoC. As above, in some examples, each SoC 1102, 1104, 1106 has eFuses that are programmed at manufacturing with values to permit repair of faulty memory by enabling redundant memory. The PMC 402 or processor 1112 of the respective SoC 1102, 1104, 1106 is capable of reading the values of the eFuses and responsively transmitting NoC protocol packets from the PMC 402 or processor 1112 via the network 214 of the NoC 106 to respective configuration frame segment drivers 108. The configuration frame segment drivers 108 are configured to process the repair data and to repair memory in a corresponding sub-region of a programmable logic region 110 by redundancy built into the respective SoC 1102, 1104, 1106.

At block 1208, locally at the master SoC, NoC packet switches, NMUs, and NSUs of the network of the NoC are configured with a NoC system-level configuration for the master SoC via the NPI of the master SoC. The PMC 402 of the SoC 1102 can read the NoC system-level configuration data from memory on-chip or off-chip and transfers the NoC system-level configuration data to the NPI root node 404. The NPI root node 404 packetizes the NoC system-level configuration data as memory mapped transactions and transmits the memory mapped transactions via the interconnected NPI switches 406 of the NPI 210 to protocol blocks 408 of appropriate NoC packet switches 206, NMUs 202, and NSUs 204 of the NoC 106 of the SoC 1102. The protocol blocks 408 then translate the memory-mapped transaction requests into formats implemented by the respective register block 212 and transmit the translated requests to the register blocks 212 of the NoC packet switches 206, NMUs 202, and NSUs 204 for processing. The appropriate data corresponding to the NoC system-level configuration data for the NoC packet switches 206, NMUs 202, and NSUs 204 is written to the register blocks 212 of the NoC packet switches 206, NMUs 202, and NSUs 204 to configure those NoC packet switches 206, NMUs 202, and NSUs 204.

With the network 214 of the NoC 106 of the master SoC 1102 being configured with the NoC system-level configuration data, and with the network 214 of the NoC 106 of the slave SoC 1104 being configured with the NoC minimal configuration data (e.g., to configure a bridge), the PMC 402 of the master SoC 1102 may communicate with the processor 1112 of the slave SoC 1104 via the networks 214 of the NoCs 106 of the SoCs 1102, 1104.

At block 1210, locally at the master SoC, one or more sub-regions of one or more programmable logic regions of the master SoC are configured via a network of the NoC and respective configuration frame segment drivers of the master SoC. In the examples described above, for example, the processing system 104 (e.g., the PMC 402) of the master SoC 1102 obtains configuration data of the sub-region of the programmable logic region 110 of the master SoC 1102. The configuration data is then handled and processed to configure one or more sub-regions of one or more programmable logic regions 110 of the master SoC 1102 as described above with respect to block 804 of method 800 of FIG. 8. Various sub-regions of the programmable logic region(s) 110 can be configured in parallel.

At block 1212, the master SoC communicates NoC system-level configuration data to a slave SoC via the networks of the NoCs of the SoCs. As described above, the networks 214 of the NoCs 106 of the SoCs 1102, 1104 are configured to permit communication between the PMC 402 of the master SoC 1102 and the processor 1112 of the slave SoC 1104. The PMC 402 of the SoC 1102 can read the NoC system-level configuration data from memory on-chip or off-chip and transfers the NoC system-level configuration data to an NMU 202 that packetizes the data into NoC protocol packets. The NoC protocol packets are transmitted from the NMU 202 to the network 214 of the NoC 106 of the SoC 1102, through one or more interposer drivers 1108 on the SoC 1102, through one or more external connectors 1110, through one or more interposer drivers 1108 on the SoC 1104, through the network 214 of the NoC 106 of the SoC 1104, to an NSU 204 of the SoC 1104. The NSU 204 reformats the data and transfers the NoC system-level configuration data for the SoC 1104 to the processor 1112 of the SoC 1104.

At block 1214, locally at the slave SoC, NoC packet switches, NMUs, and NSUs of the network of the NoC are configured with the NoC system-level configuration for the slave SoC via the NPI of the slave SoC. After having received the NoC system-level configuration data from the master SoC 1102, the slave SoC 1104 configures the NoC packet switches 206, NMUs 202, and NSUs 204 of the network 214 of the NoC 106 of the SoC 1104 via the NPI root node 404 and NPI 210 of the SoC 1104 like described above at block 1208 with respect to the master SoC 1102. With the network 214 of the NoC 106 of the SoCs 1102, 1104 being configured with the NoC system-level configuration data, and with the network 214 of the NoC 106 of the slave SoC 1106 being configured with the NoC minimal configuration data (e.g., to configure a bridge), the PMC 402 of the master SoC 1102 may communicate with the processor 1112 of the slave SoC 1106 via the networks 214 of the NoCs 106 of the SoCs 1102, 1104, 1106.

At block 1216, initiated by the master SoC, one or more sub-regions of one or more programmable logic regions of the slave SoC are configured via the networks of the NoCs of the master and slave SoCs and respective configuration frame segment drivers of the slave SoC. In the examples described above, for example, the processing system 104 (e.g., the PMC 402) of the master SoC 1102 obtains configuration data of the sub-region of the programmable logic region 110 of the slave SoC 1104. The processing system 104 (e.g., the PMC 402) of the master SoC 1102 transfers the configuration data to the configuration frame driver root node 410, which packetizes the configuration data in to NoC protocol packets. The configuration frame driver root node 410 transmits the NoC protocol packets to one or more NMUs 202, which transmits the NoC protocol packets to the network 214 of the NoC 106 of the SoC 1102. The NoC protocol packets are then routed through the network 214 of the NoC 106 of the SoC 1102, through one or more interposer drivers 1108 on the SoC 1102, through one or more external connectors 1110, through one or more interposer drivers 1108 on the SoC 1104, through the network 214 of the NoC 106 of the SoC 1104, to the appropriate NSU 204a of the SoC 1104. The configuration data is then handled and processed to configure one or more sub-regions of one or more programmable logic regions 110 of the slave SoC 1104 as described above with respect to block 804 of method 800 of FIG. 8. Various sub-regions of the programmable logic region(s) 110 can be configured in parallel.

Blocks 1212, 1214, 1216 can be repeated for any additional slave SoC, such as slave SoC 1106. The performance of blocks 1212, 1214, 1216 can be performed as described, except communications may additionally traverse any network 214 of a NoC 106 of a SoC, any additional interposer drivers, and any external connectors that intervene between the master SoC and the slave SoC. For example, communicating from the master SoC 1102 to the slave SoC 1106 includes routing communications through the network 214 of the NoC 106 of the SoC 1104.

At block 1218, various components or circuits in the multi-chip structure communicate, e.g., application data with the configured sub-region(s) of programmable logic region(s) of any SoC via the network(s) of the NoCs. The networks 214 of the NoCs 106 of the SoCs 1102, 1104, 1106 permit any component in any SoC 1102, 1104, 1106 to communicate with any sub-region of the programmable logic regions 110 in any SoC 1102, 1104, 1106. The communication can be as described above with respect to block 806 of the method 800 of FIG. 8 except may additionally be through the networks 214 of NoCs 106 of the multiple SoCs 1102, 1104, 1106.

Any master circuit within the multi-chip structure that is communicatively connected to the networks 214 of NoCs 106 of the multiple SoCs 1102, 1104, 1106 can be capable of configuring any sub-region of any programmable logic region 110 in the SoCs 1102, 1104, 1106 via the networks 214 of NoCs 106. For example, a master circuit on the SoC 1102 can transmit configuration data to a configuration frame segment driver(s) 108 on at least one of SoCs 1104, 1106 via the networks 214 of the NoCs 106 of the SoC 1102, 1104, and possibly, SoC 1106. Similarly, a master circuit on the SoC 1104 can transmit configuration data to a configuration frame segment driver(s) 108 on at least one of SoCs 1102, 1106 via the networks 214 of the NoCs 106 of the SoC 1102, 1104, or SoCs 1104, 1106. Further, a master circuit on the SoC 1106 can transmit configuration data to a configuration frame segment driver(s) 108 on at least one of SoCs 1102, 1104 via the networks 214 of the NoCs 106 of the SoC 1106, 1104, and possibly, 1102. Multiple kernels may be instantiated in any programmable logic region(s) 110 that can use independent network paths to asynchronously program different independent programmable logic regions 110. Configuring these programmable logic regions 110 may be out-of-order.

Figure 13:
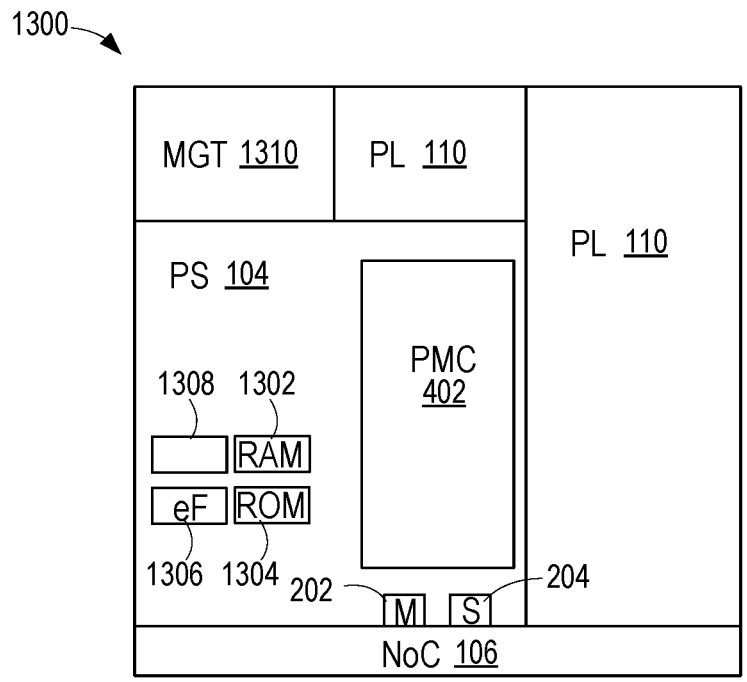
FIGS. 13 and 14 are portions of respective layouts of SoCs according to some examples.
Figure 14:
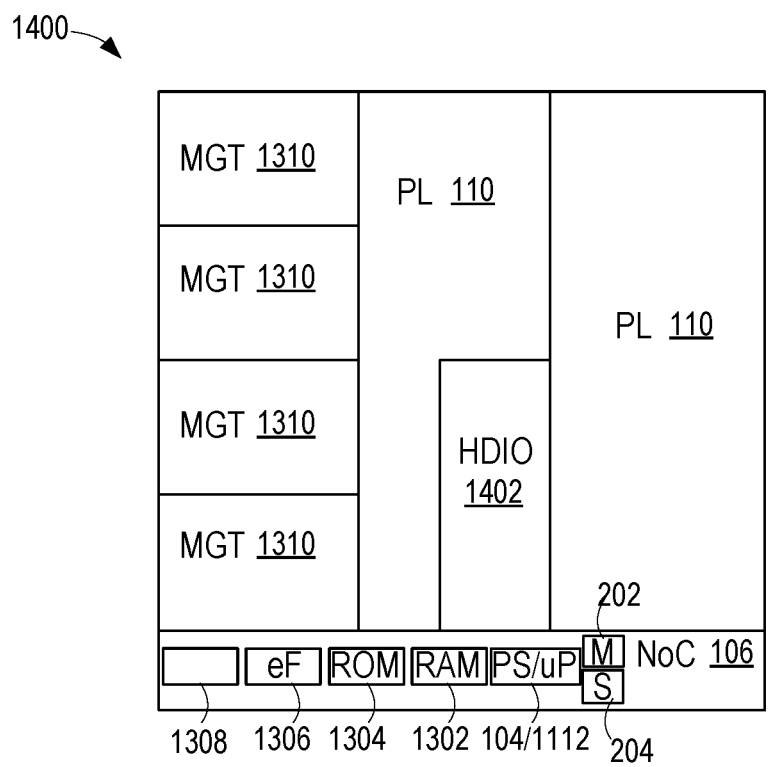

FIGS. 13 and 14 illustrate portions 1300, 1400 of respective layouts of SoCs according to some examples. The portion 1300 of FIG. 13 includes a PMC 402 in the processing system 104 and can be the SoC 102 of FIG. 5 or the master SoC 1102 of FIG. 11, for example. Random access memory (RAM) 1302, read only memory (ROM) 1304, eFuses (eF) 1306, and other support circuits 1308 are included in the processing system 104 of the portion 1300 of the layout of FIG. 13. The portion 1300 of the layout further illustrates portions of programmable logic regions 110, a portion of the NoC 106, an NMU 202, an NSU 204, and a MGT 1310 in a layout arrangement with the processing system 104.

The portion 1400 of FIG. 14 includes a processor 1112 in the processing system 104 and can be the slave SoC 1104, 1106 of FIG. 11, for example. The processing system 104 (and processor 1112), RAM 1302, ROM 1304, eFuses (eF) 1306, other support circuits 1308, NMU 202, and NSU 204 are in the area of the portion of the NoC 106. Replacing the PMC 402 with the processor 1112 (e.g., simplified and/or reduced functionality processor) frees space in the layout for other components, in the illustrated example. For example, as illustrated in the portion 1400, additional MGTs 1310 are included, a larger portion of a programmable logic region 110 is included, and a high density input/output region (HDIO) 1402 is included. The HDIO 1402 may be implemented to facility testing of the SoC due to, e.g., a simplified and/or reduced functionality processor being implemented.

While the foregoing is directed to specific examples, other and further examples may be devised without departing from the basic scope thereof, and the scope thereof is determined by the claims that follow.

What is claimed is:

1. An integrated circuit (IC) comprising:
   a programmable logic region;
   a controller;
   a programmable network connected between the controller and the programmable logic region; and
   a configuration frame driver connected between the programmable network and the programmable logic region, wherein the controller is programmed to configure the programmable logic region via the programmable network and the configuration frame driver.

2. The IC of claim 1, wherein the configuration frame driver includes configuration frame segment drivers, each of the configuration frame segment drivers being associated with a sub-region of the programmable logic region, the configuration frame segment drivers being capable of processing configuration data from the controller in parallel.

3. The IC of claim 1, wherein:
   the programmable logic region includes configurable logic blocks;
   the programmable logic region includes block memory; and
   the configuration frame driver is configured to write and read to the configurable logic blocks at a first rate and to preload and sample the block memory thereof at a second rate; and
   the second rate is greater than the first rate.

4. The IC of claim 3, wherein the second rate is two times greater than the first rate.

5. The IC of claim 1, wherein the programmable network includes:
a Network-on-Chip (NoC) master unit (NMU) connected to the controller;
a NoC slave unit (NSU) connected to the configuration frame driver;
NoC packet switches; and
routing interconnected between the NoC packet switches, the interconnected NoC packet switches communicatively coupled to and between the NMU and the NSU.

6. The IC of claim 1 further comprising a peripheral interconnect, the controller being programmed to configure the programmable network via the peripheral interconnect.

7. The IC of claim 1 further comprising a peripheral interconnect, wherein the configuration frame driver comprises configuration frame segment drivers each connected to a respective sub-region of the programmable logic region and
wherein:
the programmable network includes interconnected switches, the controller being programmed to configure the interconnected switches via the peripheral interconnect; and
the controller is programmed to configure each sub-region of the programmable logic region including by transmitting configuration data via the interconnected switches to a corresponding at least one of the configuration frame segment drivers; and
the programmable logic region is configurable to transmit application data via the interconnected switches.

8. A method for operating one or more integrated circuits, the method comprising:
configuring at least a portion of a programmable logic region comprising transmitting first configuration data from a controller via a programmable network and a configuration frame segment driver associated with the portion of the programmable logic region; and
communicating application data with the configured portion of the programmable logic region via the programmable network.

9. The method of claim 8, wherein configuring at least the portion of the programmable logic region further comprises:
routing the first configuration data through switches of the programmable network;
receiving the first configuration data from the programmable network at a slave unit;
transmitting the first configuration data from the slave unit to the configuration frame segment driver; and
writing to configuration memory by the configuration frame segment driver in response to the first configuration data.

10. The method of claim 9, wherein communicating the application data includes routing the application data through the switches of the programmable network.

11. The method of claim 9 further comprising preloading and/or sampling block memory of the programmable logic region by the configuration frame segment driver; and
wherein:
writing to the configuration memory is capable of writing at a first rate
preloading and/or sampling the block memory is capable of preloading and/or sampling at a second rate greater than the first rate.

12. The method of claim 9 further comprising configuring the switches of the programmable network comprising transmitting second configuration data from the controller via a peripheral interconnect to respective register blocks of the switches.

13. The method of claim 8 further comprising configuring the programmable network comprising transmitting second configuration data from the controller via a peripheral interconnect.

14. A method for operating one or more integrated circuits, the method comprising:
configuring at least a portion of a programmable logic region comprising transmitting first configuration data from a controller via a first programmable network and a second programmable network, wherein the controller and the first programmable network are disposed on a first chip, and the programmable logic region and the second programmable network are disposed on a second chip distinct from the first chip; and
communicating application data with the configured portion of the programmable logic region via the second programmable network.

15. A multi-chip apparatus comprising:
a first chip comprising a first Network-on-Chip (NoC), a first programmable logic region, a first configuration frame driver, and a controller, the controller being communicatively connected to a network of the first NoC, the network of the first NoC being communicatively connected to the first programmable logic region and the first configuration frame driver, and the first configuration frame driver being communicatively connected to the first programmable logic region; and
a second chip comprising a second NoC, a second programmable logic region, and a second configuration frame driver, a network of the second NoC being communicatively connected to the network of the first NoC, the second programmable logic region, and the second configuration frame driver, and the second configuration frame driver being communicatively connected to the second programmable logic region,
wherein:
the controller is configured to transmit first configuration data via the network of the first NoC to the first configuration frame driver; and
the controller is configured to transmit second configuration data via the network of the first NoC and the network of the second NoC to the second configuration frame driver.

16. The multi-chip apparatus of claim 15, wherein:
the first configuration frame driver comprises first configuration frame segment drivers, each of the first configuration frame segment drivers being associated with a corresponding sub-region of the first programmable logic region; and
the second configuration frame driver comprises second configuration frame segment drivers, each of the second configuration frame segment drivers being associated with a corresponding sub-region of the second programmable logic region.

17. The multi-chip apparatus of claim 15, wherein:
the controller is communicatively connected to a peripheral interconnect of the first NoC;
the controller is programmed to configure the network of the first NoC by transmitting third configuration data via the peripheral interconnect of the first NoC;

the second chip further comprises a processor communicatively connected to a peripheral interconnect of the second NoC; and the controller is programmed to configure the network of the second NoC by transmitting fourth configuration data via the network of the first NoC and the network of the second NoC to the processor, the processor further being configured to transmit the fourth configuration data via the peripheral interconnect of the second NoC.

18. The multi-chip apparatus of claim 15, wherein a master circuit of the first chip or the second chip is configured to transmit third configuration data via the network of the first NoC and the network of the second NoC to a configuration frame driver of the other of the first chip or the second chip.

19. The multi-chip apparatus of claim 15, wherein:

the first programmable logic region includes first configuration memory and first block memory;

the first configuration frame driver is configured to write to the first configuration memory at a first rate and to pre-sample and/or load the first block memory at a second rate, the second rate being twice the first rate;

the second programmable logic region includes second configuration memory and second block memory; and the second configuration frame driver is configured to write to the second configuration memory at a third rate and to pre-sample and/or load the second block memory at a fourth rate, the fourth rate being twice the third rate.

20. The IC of claim 1, wherein the programmable logic region, the controller, and the programmable network are disposed on a same chip.

21. The method of claim 8, wherein the programmable logic region, the controller, and the programmable network are disposed on a same chip.

\* \* \* \* \*